(12) United States Patent
Agarwala et al.

(10) Patent No.: US 8,466,056 B2
(45) Date of Patent: Jun. 18, 2013

(54) METHOD OF FORMING METAL INTERCONNECT STRUCTURES IN ULTRA LOW-K DIELECTRICS

(75) Inventors: Birendra Agarwala, Hopewell Junctions, NY (US); Du Nguyen, Danbury, CT (US); Hazara Rathore, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/949,158

(22) Filed: Nov. 18, 2010

(65) Prior Publication Data

US 2011/0117737 A1    May 19, 2011

Related U.S. Application Data

(62) Division of application No. 12/351,272, filed on Jan. 9, 2009, now abandoned.

(51) Int. Cl.
*H01L 21/4763* (2006.01)
(52) U.S. Cl.
USPC .................................. 438/622; 257/E21.577
(58) Field of Classification Search
USPC ................. 438/618, 620, 622, 624, 634, 638; 257/E21.577
See application file for complete search history.

(56) References Cited

U.S. PATENT DOCUMENTS

| | | | | |
|---|---|---|---|---|
| 6,110,648 A | * | 8/2000 | Jang | 430/312 |
| 7,138,329 B2 | * | 11/2006 | Lur et al. | 438/619 |
| 2008/0105978 A1 | * | 5/2008 | Schmitt et al. | 257/751 |

* cited by examiner

*Primary Examiner* — Quoc Hoang
(74) *Attorney, Agent, or Firm* — Lisa Ulrich; Rosa S. Yaghmour

(57) ABSTRACT

A metal interconnect structure in ultra low-k dielectrics is described having a capped interconnect layer; an interconnect feature with a contact via and a contact line formed in a dielectric layer, where the via is partially embedded into the interconnect layer; and a thin film formed on the dielectric layer and separating the dielectric layer from the contact line. A method of fabricating the interconnect structure is also described and includes forming a first dielectric on a capped interconnect element; forming a thin film over the first dielectric; forming a second dielectric on the thin film; forming a via opening on the second dielectric, the thin film and extending into the first dielectric; forming a line trench on a portion of the second dielectric; and filling the via opening and the line trench with a conductive material for forming a contact via and a contact line, where the contact via is partially embedded in the interconnect element.

20 Claims, 5 Drawing Sheets

METHOD OF FORMING METAL INTERCONNECT STRUCTURES IN ULTRA LOW-K DIELECTRICS

CROSS-CORRELATION WITH RELATED PATENTS

The present application is a Divisional of U.S. patent application Ser. No. 12/351,272, filed Jan. 9, 2009, now abandoned, entitled "Structure and Method of Forming Metal Interconnect Structures in Ultra Low-K Dielectrics".

BACKGROUND OF THE INVENTION

1. Technical Field

The present disclosure relates generally to interconnect structures formed in semiconductor devices. In particular, the present disclosure relates to a structure and methods of forming metal interconnect structures in porous ultra low-k dielectric.

2. Description of Related Art

Integrated circuit chips typically include two or more levels of conductive lines which are vertically spaced apart and separated by intermediate insulating layers. Interconnections are formed between the levels of conductive lines in the chip for providing high wiring density and good thermal performance. The interconnections are formed by means of lines and vias which are etched through the insulating layers separating the levels. The lines and vias are then filled with a conductive material or metal (e.g. Copper) to form interconnect elements (i.e. via studs).

One preferred method of making interconnect wiring networks is the damascene process. A typical damascene process for producing a multilevel structure would include: a blanket deposition of a dielectric material; patterning of the dielectric material to form openings; deposition of a conductive material onto the substrate in sufficient thickness to fill the openings; and removal of excessive conductive material from the substrate surface using a chemical reactant-based process, mechanical methods, or combined chemical-mechanical polishing techniques. A typical interconnect element includes metal vias running perpendicular to the semiconductor substrate and metal lines running parallel to the semiconductor substrate. This process results in multiple levels of conductor wiring interconnection patterns, having individual levels connected by via studs and operating to distribute signals among the various circuits on the chip. Traditionally, the dielectric material is made from an inorganic glass like silicon dioxide ($SiO_2$) or a fluorinated silica glass (FSG) film deposited by plasma enhanced chemical vapor deposition (PECVD).

A dual damascene (DD) process is another well known method of making interconnect wiring networks. In the standard DD process, the wiring interconnect network consists of two types of features: line features that traverse a certain distance across the chip, and via features which connect together lines in different levels of interconnects in a multi-level stack. Because two interconnect features are simultaneously defined to form a conductor inlaid within an insulator by a single polish step, this process is referred to as dual damascene process.

With the progress in the transistor device technology leading to the present ultra large scale integration, the overall speed of operation of these advanced chips are beginning to be limited by the signal propagation delay in the interconnection wires between the individual devices on the chips. The signal propagation delay in the interconnect structures is dependent on the resistance of the interconnect wires and the overall capacitance of the interconnect scheme in which the wires are embedded. The current focus in the microelectronics industry in building the multilayered interconnect structures on chips, is to reduce the capacitance by the use of lower dielectric constant (k) insulators, by introducing porosity in these insulators. However, the reliability of metal interconnects in porous ultra low-k dielectrics is a critical concern. In particular, the electromigration lifetime of wide-line interconnects is poor due to a lack of a liner contact between the landing via and the liner in the underlying line. Since the porous dielectric is prone to severe erosion during etch-back step needed for via embedment within the underlying line, localized "fangs" or deep and sharp trenches are formed at the bottom of the line. Because of the severe topography, these fangs are not appropriately covered with the liner. As a result, in view of a voltage bias, the metal can readily leak out through the exposed area causing time-dependent dielectric breakdown (TDDB) leakage failure as well as time-zero leakage. At present, there are no known solutions to this problem.

Accordingly, a novel method of interconnect fabrication is proposed for making a reliable metal interconnect in porous ultra low-k dielectric that would address the aforementioned challenges.

SUMMARY OF THE INVENTION

The present disclosure is directed to a structure and methods of forming interconnect structures in ultra low-k dielectrics. In one embodiment, an interconnect structure is described. The structure includes a capped interconnect layer; a dielectric layer having at least one interconnect feature, the interconnect feature having a contact via and a contact line, where the contact via is partially embedded into a portion of the interconnect line in the level below; and a thin layer formed on the dielectric layer, the thin layer separating the dielectric layer from the contact line. The interconnect layer and the interconnect feature includes a metal selected from a group consisting of Cu, Al, W and alloys thereof. In one particular embodiment, the interconnect feature includes a Cu-containing conductive material and the dielectric layer is an ultra low-k dielectric layer. In one embodiment, the thin layer is a metallic layer, where the metallic layer is selected from the group consisting of TaN, Ta, Co and W, Ti and TiN. In another embodiment, the thin layer is a low-k dielectric material. In yet another embodiment, the thin layer is SixNy, SiC, SiCxNyHz or similar dielectric material.

In another embodiment, an interconnect structure having an interconnect element formed on a first insulating layer and having a capping layer; a second insulating layer formed on the capping layer, where the second insulating layer includes at least one interconnect feature having a metal via and a metal line, where a the metal via is perpendicular to the interconnect element and is partially embedded into a portion of the interconnect element, and where the metal line is parallel to the interconnect element; and a thin layer formed over the second insulating layer, the thin layer separating the second insulating layer from the metal line. In this particular embodiment, an upper surface of the interconnect element is substantially coplanar with a surface of the first insulating layer. In addition, the second insulating layer contains a dielectric material, where the dielectric material is an ultra low-k dielectric. The interconnect element includes a conductive material, where the conductive material is selected from a group consisting of Cu, Al, W and alloys thereof. In one particular embodiment the conductive material is Cu. The thin layer is a metallic layer, where the metallic layer is selected from the group consisting of TaN, Ta, Co and W, Ti and TiN. In another embodiment, the thin layer is a low-k dielectric material. In yet another embodiment, the thin layer is SixNy, SiC, SiCxNyHz or similar dielectric material.

In yet another embodiment, an interconnect structure is described having an interconnect element having a metal and formed on a first dielectric layer; a capping layer formed on the interconnect element; an ultra low-k dielectric layer formed on the capping layer, the ultra low-k dielectric layer having at least one interconnect feature, where the interconnect feature includes a first portion parallel to the dielectric layer and a second portion perpendicular to the dielectric layer, where the second portion is substantially embedded in a portion of the interconnect element; and a thin layer formed on a surface of the first portion of the interconnect feature. In one embodiment, the first portion is a conductive via and the second portion is a conductive via line. Moreover, the thin layer is a metallic layer, where the metallic layer is selected from the group consisting of TaN, Ta, Co and W, Ti and TiN. In another embodiment, the thin layer is a low-k dielectric material. In yet another embodiment, the thin layer is SixNy.

In yet another embodiment, a method of fabricating an interconnect structure is described. The method includes forming a capped interconnect element on an insulating layer; forming a first dielectric layer on the capped interconnect element; forming a thin barrier layer over the first dielectric layer; forming a second dielectric layer on the thin barrier layer; forming a via opening on the second dielectric layer and the thin barrier layer; forming a line trench on a portion of the second dielectric layer, where the via opening extends into a portion of the first dielectric layer; and filling the via opening and the line trench with a conductive material for forming a contact via and a contact line, where a portion of the contact via is partially embedded in a portion of the interconnect element and where the thin barrier layer separates the first dielectric from the contact line. The first dielectric layer and the second dielectric layer are ultra low-k dielectrics. The interconnect element includes a material selected from a group consisting of Cu, Al, W and alloys thereof. In one embodiment, the conductive material is Cu and the thin barrier layer is a metallic layer, where the metallic layer is selected from the group consisting of TaN, Ta, Co and W, Ti and TiN. In another embodiment, the thin barrier layer is a low-k dielectric material. In yet another embodiment, the thin barrier layer is SixNy, SiC, SiCxNyHz or similar dielectric material.

In yet another embodiment, a method of forming an interconnect structure is described. The method includes forming a first ultra low-k dielectric of via height thickness on top of an underlying interconnect layer; forming an ultra thin film on the first ultra low-k dielectric layer; forming a second ultra low-k dielectric of line level thickness on the ultra thin film; etching a via through the second ultra low-k dielectric, the ultra thin film and partially through the first ultra low-k dielectric; etching a line trench in a portion of the second ultra low-k dielectric, where the via is substantially etched through the interconnect layer; and depositing a metal for defining an interconnect level. The interconnect layer includes a Cu containing material and the ultra thin film is a metallic layer, where the metallic layer is selected from the group consisting of TaN, Ta, Co and W, Ti and TiN. In one particular embodiment, the ultra ultra thin film is a low-k dielectric material. In another embodiment, the ultra thin film is SixNy, SiC, SiCxNyHz or similar dielectric material. The interconnect level includes a contact via and a contact line, where the contact via is partially embedded in a portion of the interconnect layer and where the ultra thin firm is formed between a surface of the contact line and the first ultra low-k dielectric.

Other features of the presently disclosed structure and method of making reliable metal interconnect structures in ultra low-k dielectrics will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming metal interconnect structures in ultra low-k dielectrics will be described hereinbelow with references to the figures, wherein.

DETAILED DESCRIPTION

Figure 1:
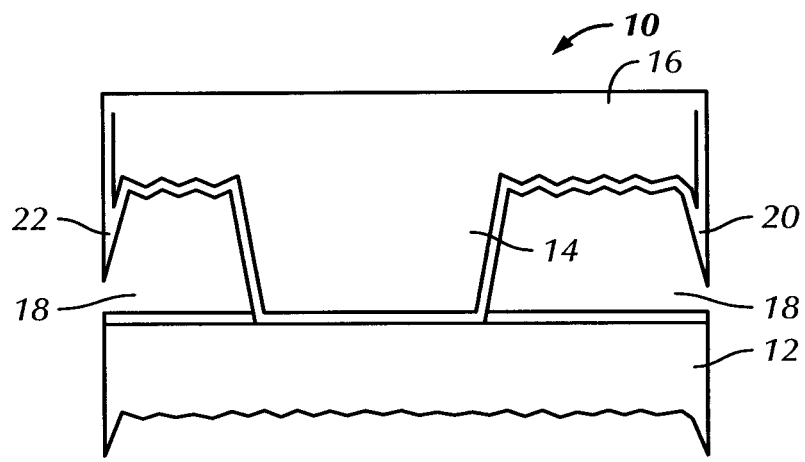
FIG. 1 illustrates a cross-sectional view of a prior art metal interconnect structure.

In the following description, numerous specific details are set forth, such as particular structures, components, materials, dimensions, processing steps and techniques, in order to provide a thorough understanding of the present disclosure. However, it will be appreciated by one skilled in the art that the invention may be practiced without these specific details. In other instances, well-known structures or processing steps have not been described in detail to avoid obscuring the invention. Thus, the materials and dimensions described herein are employed to illustrate the invention in one application and should not be construed as limiting.

Referring now to the drawing figures, wherein like references numerals identify identical or corresponding elements, an embodiment of the presently disclosed structure and method of forming metal interconnect structures in ultra low-k dielectrics, will be disclosed in detail. In particular, a new interconnect process is described, whereby a thin metallic or dielectric layer is incorporated underneath the line trench prior to the liner deposition. The proposed thin metallic or dielectric layer will eliminate any trench erosion, "fangs" or deep localized trenches formation at the porous dielectric during the etch-back. As a result, an appropriate degree of via embedment in the underlying line can be achieved without any penalty for the line erosion and fang formation. Thus, a substantial improvement of the yield and/ or reliability improvements such as via chain and line maze yield and metal line electromigration life time enhancement are achieved. In addition, this process also provides an additional benefit on short yield and TDDB reliability since there is no metal residue between metal lines.

With initial reference to FIG. 1, a prior art interconnect structure formed on a low-k dielectric is described and is designated generally as interconnect structure 10. Interconnect structure 10 includes generally a metal (e.g. Cu) line 12 formed on a first dielectric layer (not shown) and an interconnect feature having a metal via feature 14 and a line metal feature 16 formed on an ultra low-k dielectric layer 18. A barrier liner 20 is deposited prior to the deposition of the metal. Since the porous dielectric 18 is prone to rather severe erosion during etch-back, localized "fangs" 22 (i.e. deep and sharp trenches) are formed at a bottom surface of line metal feature 16. Because of the severe topography, fangs 22 cannot be covered properly by liner 20. As a result, the presence of a voltage bias, the metal can readily leak out through the exposed area causing time-dependent dielectric breakdown (TDDB) leakage failure.

FIGS. 2-8 illustrate a novel structure and methods of forming metal interconnect structures in ultra low-k dielectrics. In particular, these figures illustrate new and improved interconnect structures formed in an ultra low-k dielectric having a thin barrier layer and a method of forming the interconnect structures. In this novel proposed process, via can be substantially (i.e. adequately) embedded in the line underneath resulting in enhancement of electromigration reliability of interconnects in porous and soft Ultra Low-k dielectric. In addition, the original dielectric interface created during CMP is removed by a blanket reactive ion etch (RIE) process and then filled with a fresh ultra low-k dielectric layer. The incidence of debris is significantly reduced, since a minimal degree of CMP is needed to planarize this layer, thus having a significant improvement in TDDB reliability and time-zero leakage yield. In one embodiment, the interconnect structure includes a patterned dielectric material and at least one metal interconnect, such as, for example, a Cu-containing conductive material, having an upper surface embedded within the dielectric material; a capping layer separating the patterned dielectric material from the metal. The interconnect structure further includes an ultra low-k dielectric formed over the capping layer and a thin liner formed over the ultra low-k dielectric. At least one interconnect feature is then formed over the thin liner and the ultra low-k dielectric. The at least one interconnect feature includes a metal via feature and a metal line feature. In one embodiment, the metal via feature is perpendicular to the ultra low-k dielectric and is partially embedded into the metal interconnect. In addition, the thin liner is formed between a surface of the metal line feature and a surface of the ultra low-k dielectric. In one particular embodiment, the metal feature is a Cu-containing conductive material having uniform impurity. In addition, the Cu-containing conductive material includes Sulfur having impurity less than about 100 pp, Carbon having impurity less than about 10 ppm and Chlorine having impurity less than about 10 ppm.

Figure 2:
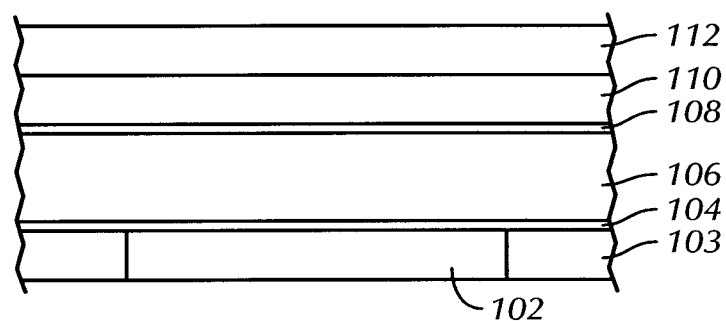
FIGS. 2-8 illustrate simplified cross-sectional views of progressive stages of a method of forming interconnect structures, in accordance with one embodiment of the present disclosure.

With particular reference to FIG. 2, a structure 100 is illustrated having an interconnect element having a metal line 102 and a via (not shown) formed on a dielectric layer 103. A dielectric capping layer 104 is provided over the metal line 102 and dielectric layer 103. In one embodiment, dielectric capping layer 104 includes a thickness ranging from about 15 nm to about 55 nm. A first, insulating layer 106 of thickness equal to the via height is disposed on an upper surface of dielectric capping layer 104. Next, a thin layer 108 is deposited over first insulating layer 106. Thin layer 108 will serve as a protective layer under the line trench during the etch-back process, in a manner described in more details hereinbelow. A second insulating layer 110 equivalent to the thickness of a line trench is deposited followed by a conventional buffered oxide layer 112 as process of record (POR).

Figure 3:
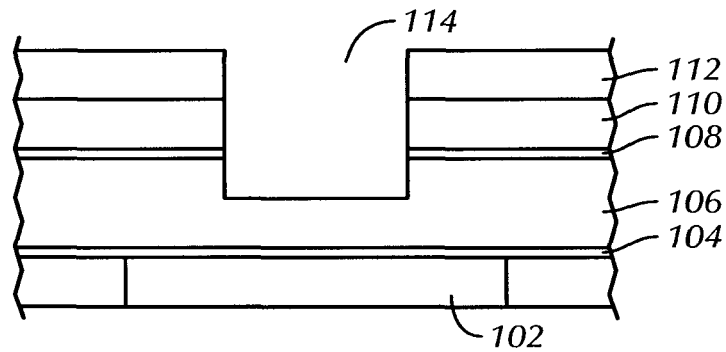

With reference to FIG. 3, interconnect opening 114 is etched through second insulating layer 110 through thin layer 108, and partially through first insulating layer 106 by conventional patterning techniques. In particular, interconnect opening 114 is etched and formed using well known etching methods, such as, for example, reactive ion etch (RIE). Interconnect opening 114 is typically referred to as a contact via feature.

In one embodiment, first insulating layer 106 is an ultra low-k interlayer dielectric having a dielectric constant, k, of 2.7 or less and a thickness ranging from about 100 nm to about 500 nm. First insulating layer 106 may include any interlevel or intralevel dielectric, and is porous. Suitable materials include, but are not limited to, organic polymers, low k PECVD films containing Si, C, O and H and spin on organosilicate glasses which have k values in the 2.7 to 2.0 range or lower. It is understood, however, that other materials having ultra low-k dielectric constant and thickness may be employed. Second insulating layer 110 may include the same or different dielectric material as that of first insulating layer 106. Moreover, the processing techniques and thickness ranges described hereinabove with respect to first insulating layer 106 are also applicable to second insulating layer 110. This disclosure shall refer to insulator layers 106 and 110 as ultra low-k dielectrics.

Metal line 102 and the via (not shown) are formed using conventional deposition techniques. Metal line 102 includes a conductive metal and a highly resistive diffusion barrier (not shown) to prevent the conductive metal from diffusing. The conductive metal in metal line 102 and the via may be selected from a material including, for example, Cu, Al, W, their alloys, and any suitable conductive material.

Dielectric capping layer 104 is formed through conventional deposition processes, such as, for example, CVD, ALD, plasma enhanced chemical vapor deposition (PECVD), etc. Dielectric capping layer 104 may include any of several materials well known in the art, for example, Si3N4, SiC, SiO2, and SiC (N, H) (i.e., nitrogen or hydrogen doped silicon carbide), etc.

Thin layer 108 includes a thickness ranging from about 1 nm to about 100 nm and thus there is minimal impact on the line resistance or capacitance. Thin'layer 108 may be selected from a material having negligible solubility in Cu, such as, for example, TaN, Ta, Co, W, Ti and TiN. Alternatively, thin layer 108 may be a low-k dielectric material such as, for example, N-Blok and PECVD Oxide. Moreover, dielectric materials such as, for example, SixNy, SiC, SiCxNyHz or similar dielectric material, such as, NbloK, PECVD, Al2O3, Flowable Oxide, TEOS, and Polyimide are also envisioned.

Figure 4:
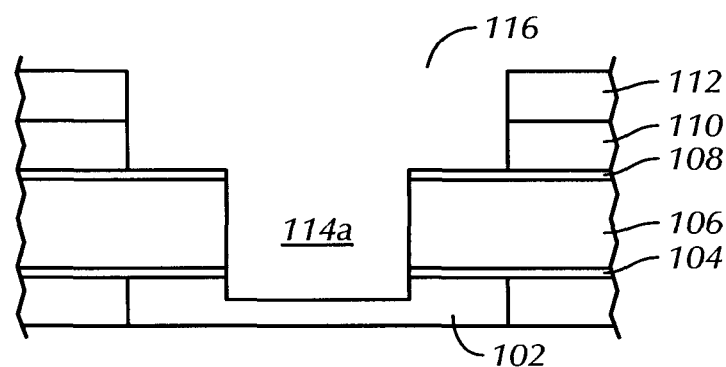

With reference to FIG. 4, a line trench 116 is formed by etching line trench 116 through ultra low-k dielectric layer 110 using conventional etching techniques. Thus a dual damascene trench and via structures 116 and 114, respectively, is shown in the figure after the photoresist is stripped.

With continued reference to FIG. 4, using a blocking mask to protect the trench of the metal line, the etching process is continued as POR to etch through the opening 114. The etching is continued to the lower metal line 102. The etching is stopped after the embeddement of opening 114a into the metal line 102. Thus, interconnect opening 114a is partially embedded in a portion of metal line 102.

Figure 5:
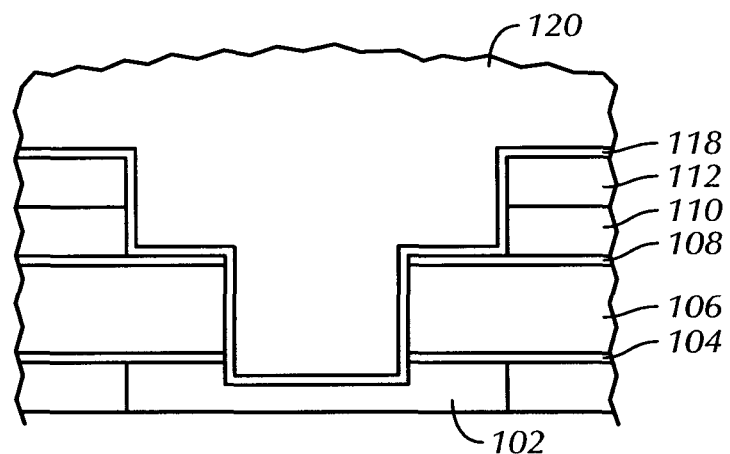

With reference to FIG. 5, a diffusion barrier liner 118 is deposited over the surface of the structure of FIG. 4 using conventional deposition techniques. The resulting recess is then filled with a conducting fill material 120 over the surface of the patterned structure. Fill material 120 is most commonly accomplished by electroplating of Cu although other methods such as chemical vapor deposition (CVD) and other materials such as Al or Au can also be used. In one embodiment, diffusion liner 118 includes a thickness ranging from about 1 nm to about 50 nm. In one particular embodiment, diffusion liner 118 includes a noble metal liner selected from a material including Ru, Ir, Co, Pt, Rh, Ni, Pd, or any other suitable noble metal. Alternatively, a highly resistive diffusion liner 118 may be selected from a material including Ta, TaN, TiN, Ru, Ru(Ta), Ru(TaN), W, WN, or any other barrier material.

Figure 6:
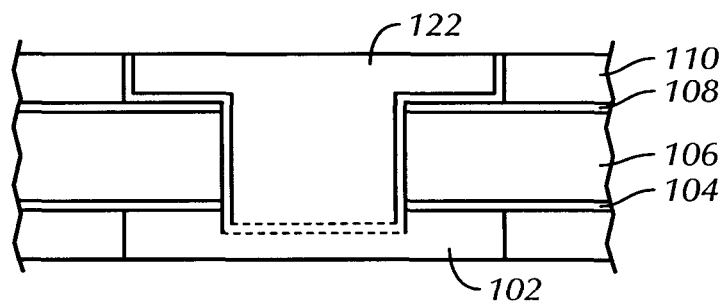

With reference to FIG. 6, fill material 120 and diffusion liner 118 are then chemical-mechanical polished (CMP) to be coplanar with the surface of the ultra low-k dielectric 110, thus defining the interconnect structure 122.

Figure 7:
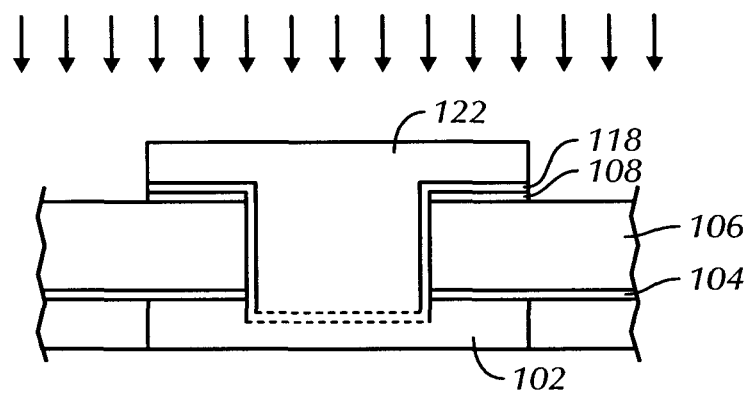

With reference to FIG. 7, the structure of FIG. 6 is subjected to a blanket etch such as RIE for removing a portion of ultra low-k dielectric 110 and a portion of thin layer 108. A chemical etch process is also envisioned. It is noted that the metal in the interconnect structure 122 will resist the RIE.

Figure 8:
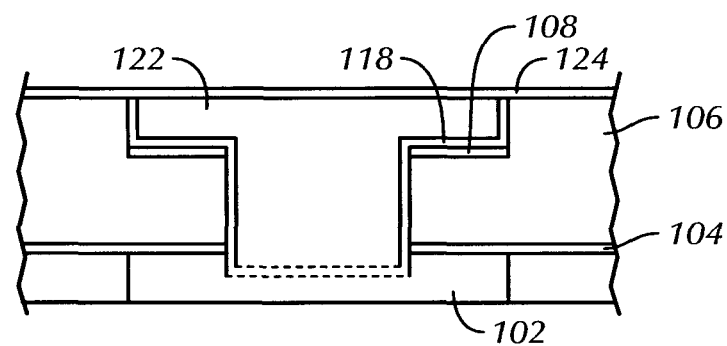

With reference to FIG. 8, a dielectric capping layer 124 is deposited to protect the top surface of interconnect structure 122 and a layer of an ultra low-k dielectric (not shown) is deposited for forming the next layer of interconnect structures.

Figure 9:
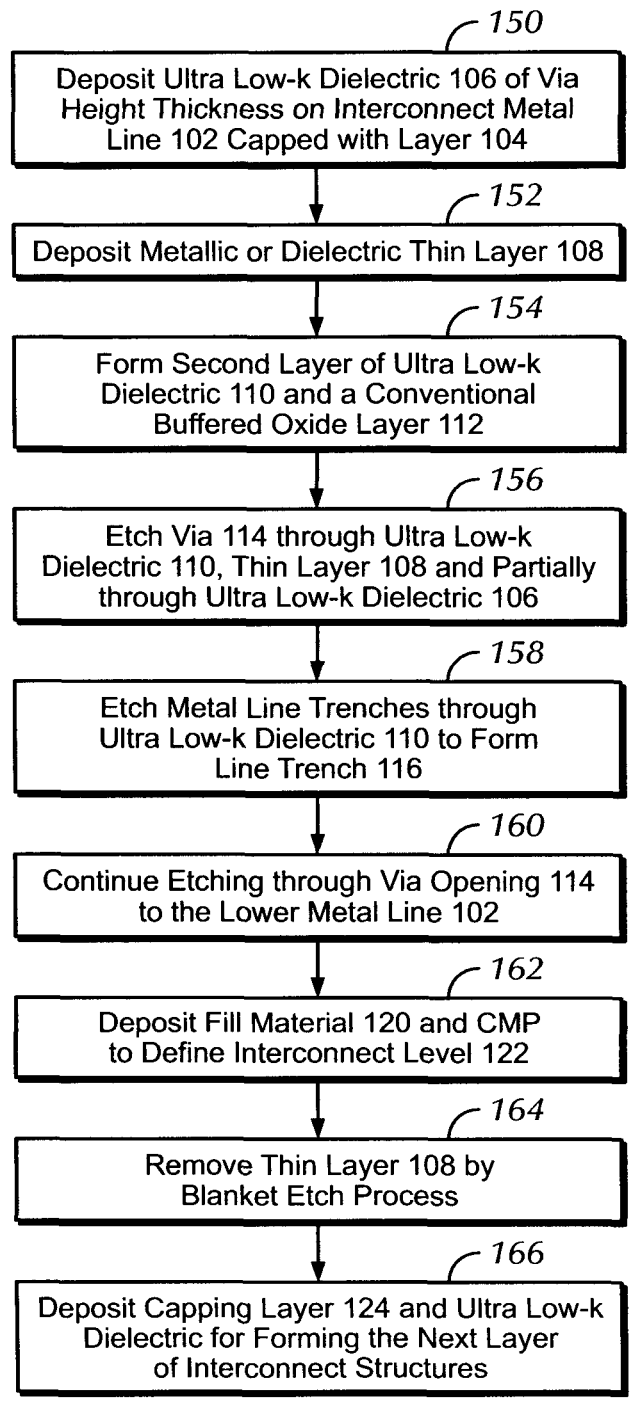
FIG. 9 is an exemplary flow diagram illustrating a method of forming an interconnect structure, in accordance with one embodiment of the present disclosure.

With reference to FIG. 9, in conjunction with FIGS. 2-8, a flow diagram of an exemplary method of forming metal interconnect structures in porous ultra low-k dielectrics, in accordance with the present disclosure, is illustrated. At step 150, an ultra low-k dielectric 106 of via height thickness is deposited on top of an interconnect metal line 102 capped with layer 104. In accordance with the present disclosure, at step 152, a thin layer 108 in the order of 1 to 5 nm of either metallic film such as TaN, Ta, Co, W, Ti or TiN or dielectric film such as N-block or SixNy is deposited. Thin layer 108 will serve as a protective layer under the line trench during the etch-back process during liner deposition. At step 154, a second layer of ultra low-k dielectric 110 equivalent to ultra low-k dielectric 106 is formed follow by a conventional buffered oxide layer 112 as process of record (POR). At step 156, after deposition of the photoresist, a via 114 is etched through ultra low-k dielectric 110, thin layer 108 and partially through ultra low-k dielectric 106. At step 158, line trench 116 is formed by etching metal line trenches through ultra low-k dielectric 110. At step 160, using a blocking mask to protect trench 114, the etching process is continued as POR to etch through the via opening 114 and to the lower metal line 102. The etching stops after the embeddement of via opening 114a into the lower metal line 102. At step 162, the current POR diffusion liner 118 deposition and Cu (i.e. fill material) 120 plating is then carried out, followed by CMP to define the interconnect level 122. At step 164, a blanket RIE/chemical etch process is carried out to remove the thin layer 108 between the lines. At step 166, next a layer of capping layer 124 and ultra low-k dielectric is deposited for forming the next layer of interconnect structures at step 152.

It will be understood that numerous modifications and changes in form and detail may be made to the embodiments of the presently disclosed structure and methods of forming metal interconnect structures in ultra low-k dielectrics. It is contemplated that numerous other configuration of the interconnect structure may be formed, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of fabricating an interconnect structure, comprising:
    forming a capped interconnect element on an insulating layer;
    forming a first dielectric layer on said capped interconnect element;
    forming a thin barrier layer over said first dielectric layer;
    forming a second dielectric layer on said thin barrier layer;
    forming a via opening in said second dielectric layer and said thin barrier layer;
    forming a line trench in a portion of said second dielectric layer, wherein said via opening extends only into a portion of said first dielectric layer;
    extending said via opening into said interconnect element after forming said line trench; and
    filling said via opening and said line trench with a conductive material for forming a contact via and a contact line;
    wherein a portion of said contact via is partially embedded in a portion of said interconnect element and further wherein said thin barrier layer separates said first dielectric from said contact line.

2. The method of fabricating the interconnect structure of claim 1, wherein said interconnect element includes a material selected from a group consisting of Cu, Al, W and alloys thereof.

3. The method of fabricating the interconnect structure of claim 1, wherein said conductive material is Cu.

4. The method of fabricating the interconnect structure of claim 1, wherein the thin barrier layer is a metallic layer.

5. The method of fabricating the interconnect structure of claim 4, wherein said metallic layer is selected from the group consisting of TaN, Ta, Co and W, Ti and TiN.

6. The method of fabricating the interconnect structure of claim 1, wherein said thin barrier layer is a low-k dielectric material.

7. The method of fabricating the interconnect structure of claim 1, wherein said thin barrier layer is selected from a group consisting of SixNy, SiCx, SiCxNyHz, NbloK, PECVD, Al2O3, Flowable Oxide, TEOS, and Polyimide.

8. The method of fabricating the interconnect structure of claim 1, wherein said first dielectric layer and said second dielectric layer are ultra low-k dielectrics.

9. The method of claim 1 further comprising:
    removing at least a portion of said second dielectric layer and at least a portion of said thin barrier layer;
    depositing additional first dielectric layer to replace the at least a portion of said second dielectric layer removed; and
    depositing a dielectric capping layer over said conductive material and said additional first dielectric layer to form a flat surface of said conductive material and said additional first dielectric layer.

10. A method of forming an interconnect structure, the method comprising:
    forming a first ultra low-k dielectric of via height thickness on top of an underlying interconnect layer;
    forming an ultra thin film on said first ultra low-k dielectric layer;
    forming a second ultra low-k dielectric of line level thickness on said ultra thin film;
    etching a via through said second ultra low-k dielectric, said ultra thin film and only partially through said first ultra low-k dielectric;
    etching a line trench in a portion of said second ultra low-k dielectric;
    protecting the line trench from being etched while etching the via entirely through the first ultra low-k dielectric and into the interconnect layer after etching said line trench; and
    depositing a metal for defining an interconnect level.

11. The method of forming the interconnect structure of claim 10, wherein said interconnect layer includes a Cu containing material.

12. The method of forming the interconnect structure of claim 10, wherein the ultra thin film is a metallic layer.

13. The method of forming the interconnect structure of claim 12, wherein said metallic layer is selected from the group consisting of TaN, Ta, Co and W, Ti and TiN.

14. The method of forming the interconnect structure of claim 10, wherein said ultra thin film is a low-k dielectric material.

15. The method of forming the interconnect structure of claim 10, wherein said ultra thin film is selected from a group consisting of SixNy, SiCx, SiCxNyHz, NbloK, PECVD, Al2O3, Flowable Oxide, TEOS, and Polyimide.

16. The method of claim 10 further comprising:
   removing at least a portion of said second ultra low-k dielectric and at least a portion of said ultra thin film;
   depositing additional first ultra low-k dielectric to replace the at least a portion of said second ultra low-k dielectric removed; and
   depositing a dielectric capping layer over said metal and said additional first ultra low-k dielectric to form a flat surface of said metal and said additional first ultra low-k dielectric.

17. A method of forming an interconnect structure, the method comprising:
   forming on an underlying interconnect element a first dielectric layer;
   depositing over said first dielectric layer a second dielectric layer;
   etching a contact via through said second dielectric layer and only a portion of said first dielectric layer;
   etching a line trench in a portion of said second dielectric layer;
   protecting the line trench from etching while etching the contact via entirely through the first dielectric layer and into the interconnect element after etching said line trench;
   filling said contact via and said line trench with a conductive material;
   removing at least a portion of said second dielectric layer;
   depositing additional first dielectric layer to replace the at least a portion of said dielectric layer removed; and
   depositing a dielectric capping layer over said conductive material and said additional first dielectric layer to form a flat surface of said conductive material and said additional first dielectric layer.

18. The method of forming the interconnect structure of claim 17, wherein said metal is selected from a group consisting of Cu, Al, W and alloys thereof.

19. The method of forming the interconnect structure of claim 17, further comprising forming a thin layer between said first dielectric layer and said second dielectric layer, wherein said thin layer is a low-k dielectric material.

20. The method of fabricating the interconnect structure of claim 17, wherein said first dielectric layer, said second dielectric layer and said third dielectric layer are ultra low-k dielectrics.

* * * * *